(12) United States Patent
Choi et al.

(10) Patent No.: US 12,429,283 B2
(45) Date of Patent: Sep. 30, 2025

(54) METHOD AND APPARATUS FOR TREATING A SUBSTRATE

(71) Applicant: SEMES CO., LTD., Cheonan-si (KR)

(72) Inventors: Hae-Won Choi, Daejeon (KR); Anton Koriakin, Cheonan-si (KR); Joon Ho Won, Suwon-si (KR); Min Woo Kim, Seoul (KR); Ki Hoon Choi, Cheonan-si (KR); Eung Su Kim, Yongin-si (KR); Tae Hee Kim, Yongin-si (KR); Pil Kyun Heo, Yongin-si (KR); Jang Jin Lee, Hwaseong-si (KR); Jin Yeong Sung, Chungcheongbuk-do (KR)

(73) Assignee: Semes Co., Ltd., Cheonan-si (KR)

( * ) Notice: Subject to any disclaimer, the term of this patent is extended or adjusted under 35 U.S.C. 154(b) by 848 days.

(21) Appl. No.: 17/692,395

(22) Filed: Mar. 11, 2022

(65) Prior Publication Data
US 2022/0290921 A1 Sep. 15, 2022

(30) Foreign Application Priority Data
Mar. 15, 2021 (KR) .......................... 10-2021-0033257

(51) Int. Cl.
*F26B 5/00* (2006.01)
(52) U.S. Cl.
CPC .................................... *F26B 5/005* (2013.01)
(58) Field of Classification Search
CPC ...................................................... F26B 5/005
(Continued)

(56) References Cited

U.S. PATENT DOCUMENTS 5,813,133 A * 9/1998 Munter ................. F26B 25/006
34/421
6,105,274 A * 8/2000 Ballantine ......... H01L 21/67109
34/340
(Continued)

FOREIGN PATENT DOCUMENTS

CN 108074844 A 5/2018
CN 112289702 A * 1/2021 ......... B05C 11/1002
(Continued)

OTHER PUBLICATIONS

Taiwanese Office Action dated Oct. 6, 2022 issued in corresponding Taiwanese Appln. No. 11120990800.
(Continued)

*Primary Examiner* — Stephen M Gravini
(74) *Attorney, Agent, or Firm* — Harness, Dickey & Pierce, P.L.C.

(57) ABSTRACT

The inventive concept provides a method for treating a substrate. The method for treating a substrate comprises: a pressurization step for increasing a pressure of an inner space of a chamber by supplying a treating fluid to the inner space, after taking the substrate into the inner space; a flow step for generating a flow of the treating fluid by combination of supplying and discharging the treating fluid to and from the inner space; and a depressurization step of decreasing the pressure of the inner space by discharging the treating fluid from the inner space, and wherein the pressurization step comprises: a bottom side supply process for increasing the pressure of the inner space by supplying the treating fluid to a backside of the substrate taken into the inner space; and a top side supply process of increasing the pressure of the inner space by supplying the treating fluid to a top side of the substrate taken into the inner space.

10 Claims, 13 Drawing Sheets

(58) Field of Classification Search
USPC .......................................................... 34/201
See application file for complete search history.

(56) References Cited

U.S. PATENT DOCUMENTS

| | | | | |
|---|---|---|---|---|
| 7,093,375 | B2 * | 8/2006 | O'Donnell | .......... B05C 11/1039 |
| | | | | 34/79 |
| 9,275,847 | B2 * | 3/2016 | Jung | .................. H01L 21/67051 |
| 10,281,210 | B2 * | 5/2019 | Miyazaki | ................ F26B 11/18 |
| 10,361,100 | B2 | 7/2019 | Lee et al. | |
| 10,473,396 | B2 * | 11/2019 | Tice | .................. H01L 21/67028 |
| 11,328,925 | B2 * | 5/2022 | Sasaki | ............... H01L 21/02101 |
| 11,890,639 | B2 * | 2/2024 | Heo | ...................... B05C 5/0208 |
| 11,942,337 | B2 * | 3/2024 | Lim | .................. H01J 37/32715 |
| 12,211,675 | B2 * | 1/2025 | Kim | .................. H01J 37/32834 |
| 2009/0101186 | A1 | 4/2009 | Hiroshiro et al. | |
| 2013/0028690 | A1 | 1/2013 | Park et al. | |
| 2019/0096717 | A1 | 3/2019 | Lee et al. | |
| 2020/0388512 | A1 * | 12/2020 | Biwa | .................. H01L 21/02101 |
| 2020/0411344 | A1 | 12/2020 | Choi et al. | |
| 2022/0290921 | A1 * | 9/2022 | Choi | .................. H01L 21/67028 |
| 2023/0148026 | A1 * | 5/2023 | Lee | ...................... H01J 37/3244 |
| | | | | 156/345.26 |

FOREIGN PATENT DOCUMENTS

| | | | | |
|---|---|---|---|---|
| EP | 2966673 | A1 * | 1/2016 | .............. F26B 11/18 |
| JP | 2007-027696 | A | 2/2007 | |
| JP | 2013-033963 | A | 2/2013 | |
| JP | 6922048 | B2 | 8/2021 | |
| JP | 7565965 | B2 * | 10/2024 | .............. F26B 21/10 |
| KR | 10-2015-0008404 | A | 1/2015 | |
| KR | 10-2019-0011854 | A | 2/2019 | |
| KR | 10-2019-0041158 | A | 4/2019 | |
| KR | 102037906 | B1 | 11/2019 | |
| KR | 10-2020-0139378 | A | 12/2020 | |
| KR | 102358561 | B1 | 2/2022 | |
| KR | 20220128750 | A * | 9/2022 | |
| TW | I819517 | B * | 10/2023 | |
| WO | WO-2020/149556 | A1 | 7/2020 | |
| WO | WO-2020/231037 | A1 | 11/2020 | |

OTHER PUBLICATIONS

Korean Office Action dated Feb. 10, 2023 issued in corresponding Korean Appln. No. 10-2021-0033257.
Japanese Office Action dated Apr. 18, 2023 issued in corresponding Japanese Appln. No. 2022-039357.
Office Action for Chinese Application No. 202210239103.8 dated Jan. 24, 2025.

* cited by examiner

METHOD AND APPARATUS FOR TREATING A SUBSTRATE

CROSS-REFERENCE TO RELATED APPLICATIONS

A claim for priority under 35 U.S.C. § 119 is made to Korean Patent Application No. 10-2021-0033257 filed on Mar. 15, 2021, in the Korean Intellectual Property Office, the entire contents of which are hereby incorporated by reference.

BACKGROUND

Embodiments of the inventive concept described herein relate to a substrate treating method and a substrate treating apparatus.

In order to manufacture a semiconductor device, a desired pattern is formed on a substrate through various processes such as photography, etching, ashing, ion implantation, and thin film deposition, etc. Various treating liquids and treating gases are used in each process. In addition, a drying process is performed on the substrate to remove a treating liquid used to treat the substrate from the substrate. Generally, the drying process for removing the treating liquid from the substrate includes a rotary drying process of rotating the substrate at a high speed and removing the treating liquid remaining on the substrate by a centrifugal force by the rotation of the substrate. However, in this rotary drying method, there is a high risk of a leaning phenomenon occurring in a pattern formed on the substrate. Accordingly, recently a supercritical drying process has been used. In the supercritical drying process, the substrate is introduced into a chamber capable of maintaining a high-pressure and a high-temperature atmosphere, and then a carbon dioxide in a supercritical state is supplied onto the substrate to remove the treating liquid (e.g., an organic solvent, a developing liquid solvent, etc.) remaining on the substrate. The carbon dioxide in the supercritical state has a high dissolvability and a high permeability. Accordingly, when the carbon dioxide in the supercritical state is supplied to the substrate, the carbon dioxide easily permeates into the pattern on the substrate. Accordingly, it is possible to easily remove the treating liquid remaining between the patterns formed on the substrate.

FIG. 1 is a view illustrating a pressure change in a chamber when a conventional supercritical drying process is performed. Referring to FIG. 1, a conventional supercritical drying process includes a pressurization step S100, a process step S200, and a depressurization step S300. In the pressurization step S100, a carbon dioxide is supplied into the chamber to increase a pressure in the chamber to a first pressure CP1, which is a target pressure. The first pressure CP1 is generally a pressure higher than a critical pressure at which the carbon dioxide can maintain a supercritical state. In the process step S200, the carbon dioxide is repeatedly discharged/supplied from/to a space in the chamber. Accordingly, the pressure in the chamber changes between the first pressure CP1 and a second pressure CP2. In the depressurization step S300, the carbon dioxide is discharged from the space in the chamber to lower the pressure in the chamber to about an atmospheric pressure. As described above, in the conventional supercritical drying process, the pressure in the chamber is repeatedly changed (pressure swing due to a partial pressure difference) in the process step S200 to remove the treating liquid on the substrate from the substrate.

In general, in the pressurization step S100, the carbon dioxide F is supplied to the back side (bottom surface) of the substrate W in an upward direction as illustrated in FIG. 2 to increase a pressure of the space in the chamber. This is because if the carbon dioxide F is supplied to a front side (top surface) of the substrate W in a downward direction while the pressure of the space in the chamber has not reached the aforementioned critical pressure, a liquid film formed by the treating liquid L remaining on a top surface of the substrate W may be broken or a non-uniform drying may occur. However, an evaporation of the treating liquid L remaining on the substrate starts from the pressurization step S100. That is, when the carbon dioxide F is supplied to the back side of the substrate W as described above, the supplied carbon dioxide F forms an upward flow as a whole. The upward flow changes the liquid film formed by the treating liquid L on the top surface of the substrate W into a curved shape. The upward flow causes a large number of defects and non-uniform drying marks on the substrate W. The drying marks propagate rapidly at an edge region of the substrate W which have a relatively thin liquid film. As described above, the drying marks occurring on the substrate W are not improved even if the pressure of the space in the chamber is further changed in the process step S200 or if a supply flow rate or a supply speed of the carbon dioxide is increased.

SUMMARY

Embodiments of the inventive concept provide a substrate treating method and a substrate treating apparatus for efficiently treating a substrate.

Embodiments of the inventive concept also provide a substrate treating method and a substrate treating apparatus for increasing a drying treatment efficiency of a substrate.

Embodiments of the inventive concept also provide a substrate treating method and a substrate treating apparatus for effectively removing a treating liquid remaining on a substrate.

Embodiments of the inventive concept also provide a substrate treating method and a substrate treating apparatus for effectively removing a developing liquid remaining on a substrate.

Embodiments of the inventive concept also provide a substrate treating method and a substrate treating apparatus for minimizing a drying mark occurring on a substrate during a performing of a drying treatment on the substrate.

The technical objectives of the inventive concept are not limited to the above-mentioned ones, and the other unmentioned technical objects will become apparent to those skilled in the art from the following description.

The inventive concept provides a method for treating a substrate. The method for treating a substrate includes a pressurization step for increasing a pressure of an inner space of a chamber by supplying a treating fluid to the inner space, after taking the substrate into the inner space; a flow step for generating a flow of the treating fluid by combination of supplying and discharging the treating fluid to and from the inner space; and a depressurization step of decreasing the pressure of the inner space by discharging the treating fluid from the inner space, and wherein the pressurization step comprises: a bottom side supply process for increasing the pressure of the inner space by supplying the treating fluid to a backside of the substrate taken into the inner space; and a top side supply process of increasing the pressure of the inner space by supplying the treating fluid to a top side of the substrate taken into the inner space.

In an embodiment, the top side supply process is performed after the bottom side supply process.

In an embodiment, the pressurization step further comprises a discharge process for discharging the treating fluid supplied to the inner space, after the top side supply process.

In an embodiment, the top side supply process and the discharge process are continuously performed.

In an embodiment, the discharge process discharges the treating fluid supplied to the inner space in a downward direction.

In an embodiment, the top side supply process supplies the treating fluid toward a top surface of the substrate.

In an embodiment, the pressurization step increases the pressure of the inner space to a preset pressure, and the top side supply process and the discharge process are performed before the pressure of the inner space reaches the preset pressure.

In an embodiment, a lower limit of a pressure range of the inner space changed by the top side supply process and the discharge process is higher than a critical pressure of the treating fluid.

In an embodiment, a pressure range of the inner space changed by the top side supply process and the discharge process comprises a critical pressure of the treating fluid.

The inventive concept provides a method for treating a substrate using a treating fluid in a supercritical state to dry the substrate. The method for treating a substrate includes a transfer step of taking the substrate with its top surface in a wetted state into an inner space of a chamber by a treating liquid; a pressurization step of increasing a pressure of the inner space to a preset pressure by supplying the treating fluid to the inner space after the transfer step, and a treating step of supplying the treating fluid to the inner space and/or discharging the treating fluid from the inner space to remove the treating liquid from the substrate, and wherein the pressurization step comprises: a top side supply process of increasing a pressure of the inner space by supplying the treating fluid toward a top side of the substrate taken into the inner space; and a discharge process of discharging the treating fluid supplied to the inner space.

In an embodiment, the pressurization step further comprises a bottom side supply process of increasing the pressure of the inner space by supplying the treating fluid toward a back side of the substrate taken into the inner space, and wherein the top side supply process is performed at a later time than the bottom side supply process.

In an embodiment, the treating fluid supplied at the top side supply process is supplied to a top surface of the substrate in a downward direction.

In an embodiment, the treating fluid includes a carbon dioxide ($CO_2$).

In an embodiment, the treating liquid is a developing liquid.

In an embodiment, the developing liquid includes an N-Butyl Acetate.

The inventive concept provides a substrate treating apparatus. The substrate treating apparatus includes a body having an inner space; a support member for supporting a substrate in the inner space; a fluid supply unit for supplying a treating fluid for drying the substrate to the inner space; a fluid discharge unit for discharging the treating fluid from the inner space; and a controller for controlling the fluid supply unit and the fluid discharge unit, and wherein the fluid supply unit comprises: a top supply line for supplying the treating fluid toward a top side of the substrate supported by the support member; and a bottom supply line for supplying the treating fluid toward a back side of the substrate supported by the support member, and wherein, during a pressurizing step of increasing a pressure of the inner space to a preset pressure after the substrate is taken into the inner space, the controller controls the fluid supply unit and the fluid discharge unit so that a supply of the treating fluid of the top supply line and a discharge of the treating fluid of the fluid discharge unit are performed at least one, respectively.

In an embodiment, the controller controls the fluid supply unit so that a supply of the treating fluid of the bottom supply line is performed during the pressurization step and a supply time of the treating fluid of the top supply line is later than a supply time of the treating fluid of the bottom supply line.

In an embodiment, the top supply line is configured to supply of the treating fluid toward top surface of the substrate supported by the support member.

In an embodiment, the fluid discharge unit comprises: a fluid discharge line for communicating with the inner space; and a discharge valve installed at the fluid discharge line, and wherein the fluid discharge line is configured so when the treating fluid is discharged the treating fluid flows from a top to a bottom of the inner space.

In an embodiment, the substrate treating apparatus further includes a heating member for increasing a temperature of the inner space so the treating fluid supplied to the inner space is converted to a supercritical state or may maintain the supercritical state, and wherein the treating fluid supplied by the fluid supply unit comprises a carbon dioxide $CO_2$.

According to an embodiment of the inventive concept, a substrate may be efficiently treated.

According to an embodiment of the inventive concept, an efficiency of a drying treatment of a substrate may be increased.

According to an embodiment of the inventive concept, a treating liquid remaining on a substrate may be efficiently removed.

According to an embodiment of the inventive concept, a developing liquid remaining on a substrate may be effectively removed.

According to an embodiment of the inventive concept, a drying mark occurring on a substrate may be minimized while performing a drying treatment on the substrate.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
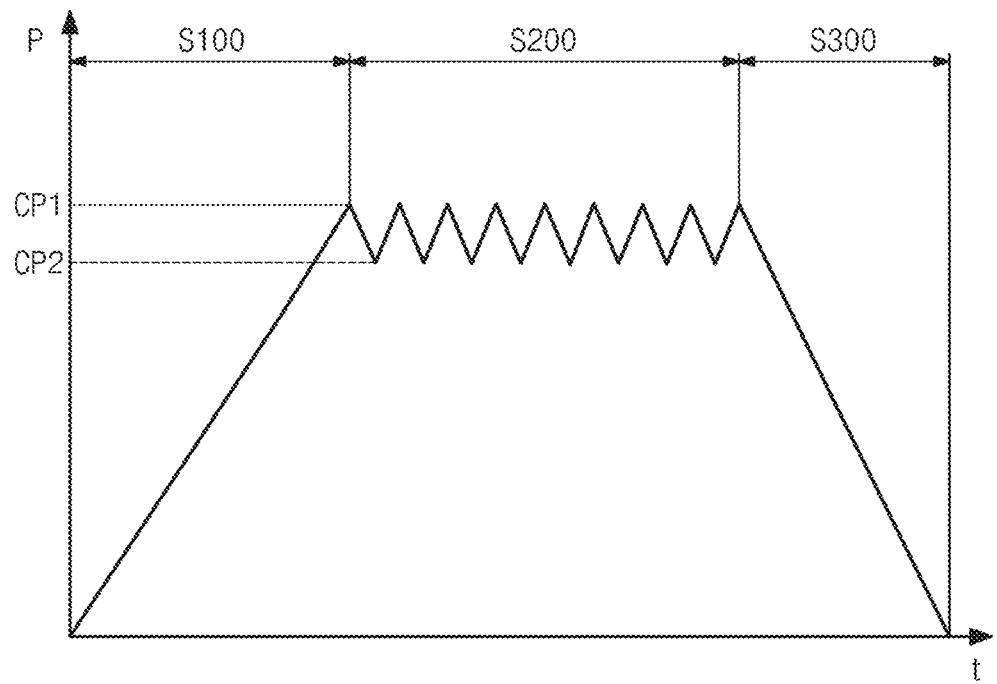
FIG. 1 is a view illustrating a pressure change in a chamber when a conventional supercritical drying process is performed.
Figure 2:
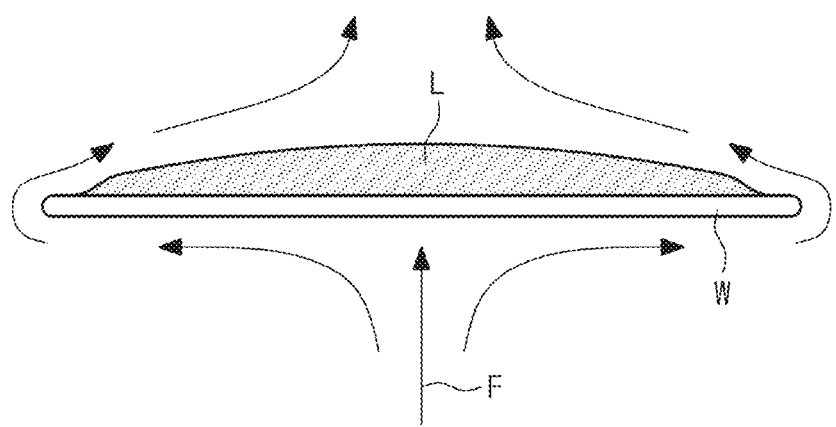
FIG. 2 is a view illustrating an upward airflow generated in a pressurization step of FIG. 1 and a liquid film formed on a substrate in the pressurization step of FIG. 1.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Hereinafter, example embodiments of the inventive concept will be described with reference to FIG. 3 to FIG. 14.

Figure 3:
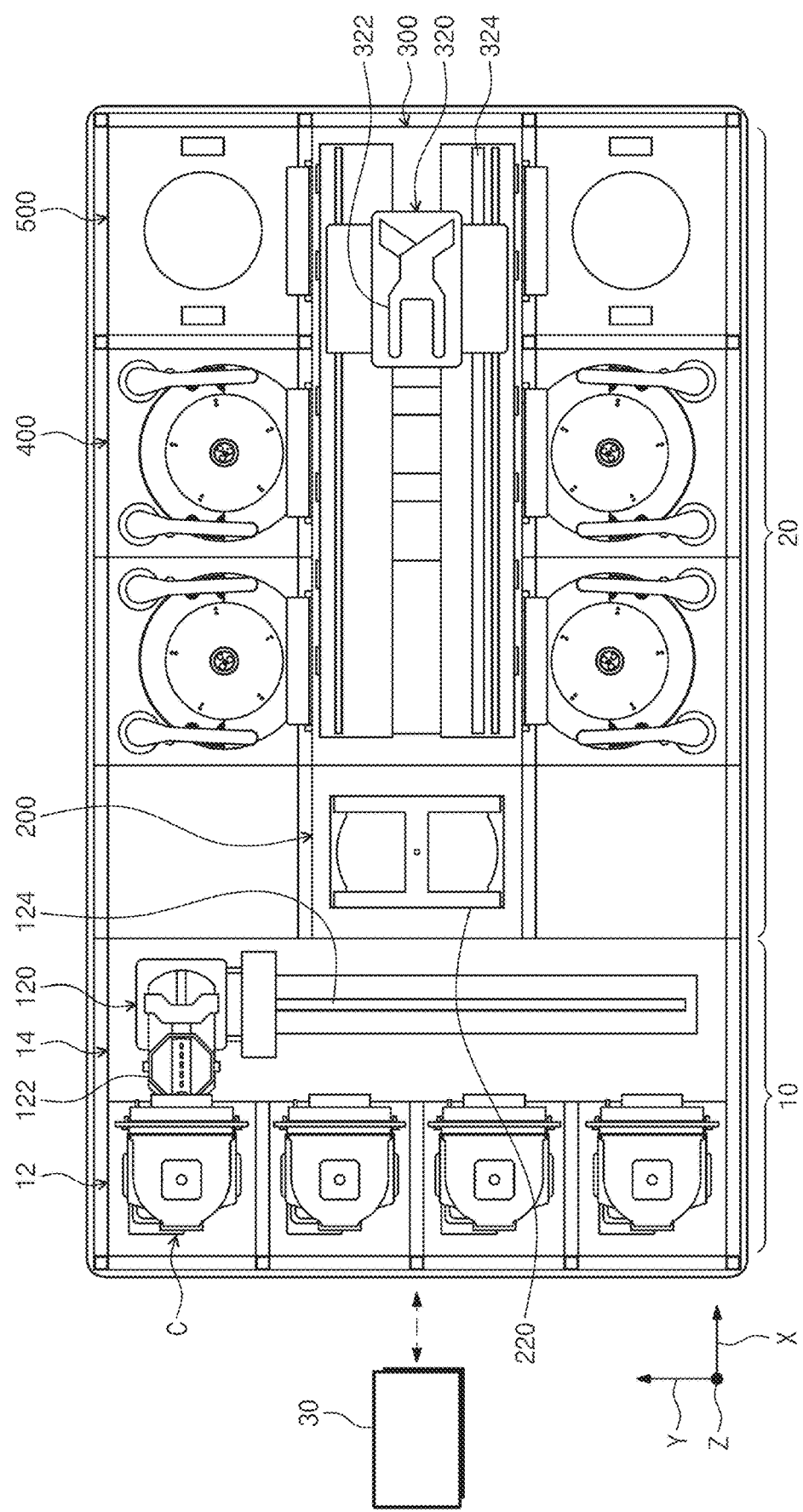
FIG. 3 is a plan view schematically illustrating a substrate treating apparatus according to an embodiment of the inventive concept.

FIG. 3 is a plan view schematically illustrating a substrate treating apparatus according to an embodiment of the inventive concept.

Referring to FIG. 3, the substrate treating apparatus includes an index module 10, a treating module 20, and a controller 30. The index module 10 and the treating module 20 are disposed in a direction. Hereinafter, the direction in which the index module 10 and the treating module 20 are disposed will be referred to as a first direction X, a direction perpendicular to the first direction X will be referred to as a second direction Y, and a direction perpendicular to both the first direction X and the second direction Y will be referred to as a third direction Z.

The index module 10 transfers a substrate W from a container C in which the substrate W is stored to the treating module 20, and stores a substrate W to which a treating has been completed at the treating module 20 in the container C. A lengthwise direction of the index module 10 is provided in the second direction Y. The index module 10 has a load port 12 and an index frame 14. The index frame 14 is located between the load port 12 and the treating module 20. The container C in which the substrates W are stored is placed on the load port 12. A plurality of load ports 12 may be provided, and the plurality of load ports 12 may be disposed along the second direction Y.

For the container C, a sealed container such as a front open unified pod FOUP may be used. The container C may be placed on the load port 12 by a transfer means (not illustrated) such as an overhead transfer, an overhead conveyor, or an automatic guided vehicle or by an operator.

The index frame 14 is provided with an index robot 120. In the index frame 14, a guide rail 124 with its lengthwise direction in the second direction Y may be provided, and the index robot 120 may be provided to be movable along the guide rail 124. The index robot 120 may include a hand 122 on which the substrate W is placed, and the hand 122 may be forwardly and backwardly movable, rotatable around the third direction Z, and movable along the third direction Z. A plurality of hands 122 are provided to be spaced apart in an up/down direction, and the hands 122 may be forwardly and backwardly movable independently of each other.

The controller 30 may control the substrate treating apparatus. The controller may include a process controller e.g., a microprocessor (computer) that executes a control of the substrate treating apparatus, a user interface e.g., a keyboard in which an operator performs a command input operation or the like in order to manage the substrate treating apparatus, a display for visualizing and displaying an operation situation of the substrate treating apparatus, and the like, and a storage unit storing a control program for executing the process performed in the substrate treating apparatus under the control of the process controller, a various data and a program (i.e., treatment recipe) for executing various process in each component according to treating conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

The controller 30 may control the substrate treating apparatus to perform the substrate treating method described below. For example, the controller 30 may control the fluid supply unit 530 and the fluid discharge unit 550 to perform the substrate treating method.

The treating module 20 includes a buffer unit 200, a transfer chamber 300, a liquid treating chamber 400, and a drying chamber 500. The buffer unit 200 provides a space in which the substrate W carried into the treating module 20 and the substrate W carried out from the treating module 20 temporarily stay. The liquid treating chamber 400 supplies a liquid onto the substrate W to perform a liquid treatment process of liquid treating the substrate W. The drying chamber 500 performs a drying process of removing a liquid remaining on the substrate W. The transfer chamber 300 transfers the substrate W between the buffer unit 200, the liquid treating chamber 400, and the drying chamber 500.

A lengthwise direction of the transfer chamber 300 may be provided in the first direction X. The buffer unit 200 may be disposed between the index module 10 and the transfer chamber 300. The liquid treating chamber 400 and the drying chamber 500 may be disposed on a side of the transfer chamber 300. The liquid treating chamber 400 and the transfer chamber 300 may be disposed along the second direction Y. The drying chamber 500 and the transfer chamber 300 may be disposed along the second direction Y. The buffer unit 200 may be located at an end of the transfer chamber 300.

According to an embodiment, the liquid treating chambers 400 may be disposed on both sides of the transfer chamber 300, the drying chambers 500 may be disposed on both sides of the transfer chamber 300, and the liquid treating chambers 400 may be disposed closer to the buffer unit 200 than the drying chambers 500. In some embodiments, at one and/or both sides of the transfer chamber 300, the liquid treating chambers 400 may be provided in an array of A×B (A and B are natural numbers greater than 1 or 1) along the first direction X and the third direction Z. In some embodiments, at one and/or both sides of the transfer chamber 300, the drying chambers 500 may be provided in an array of C×D (C and D are natural numbers greater than 1 or 1) along the first direction X and the third direction Z. In some embodiments, only liquid treating chambers 400 may be provided at one side of the transfer chamber 300, and only dry chambers 500 may be provided at the other side of the transfer chamber 300.

The transfer chamber 300 has a transfer robot 320. In the transfer chamber 300, a guide rail 324 with its lengthwise direction provided in the first direction X may be provided, and the transfer robot 320 may be provided to be movable on the guide rail 324. The transfer robot 320 may include a hand 322 on which the substrate W is placed, and the hand 322 may be provided to be forwardly and backwardly movable, rotatable around the third direction Z as an axis, and movable along the third direction Z. A plurality of hands 322 are provided to be spaced apart in the up/down direction, and the hands 322 may be forwardly and backwardly movable independently from each other.

The buffer unit 200 includes a plurality of buffers 220 on which the substrate W is placed. The buffers 220 may be disposed to be spaced apart from each other in the third direction Z. A front face and a rear face of the buffer unit 200 are opened. The front face is a surface facing the index module 10, and the rear face is a surface facing the transfer chamber 300. The index robot 120 may access the buffer unit 200 through the front face, and the transfer robot 320 may access the buffer unit 200 through the rear face.

Figure 4:
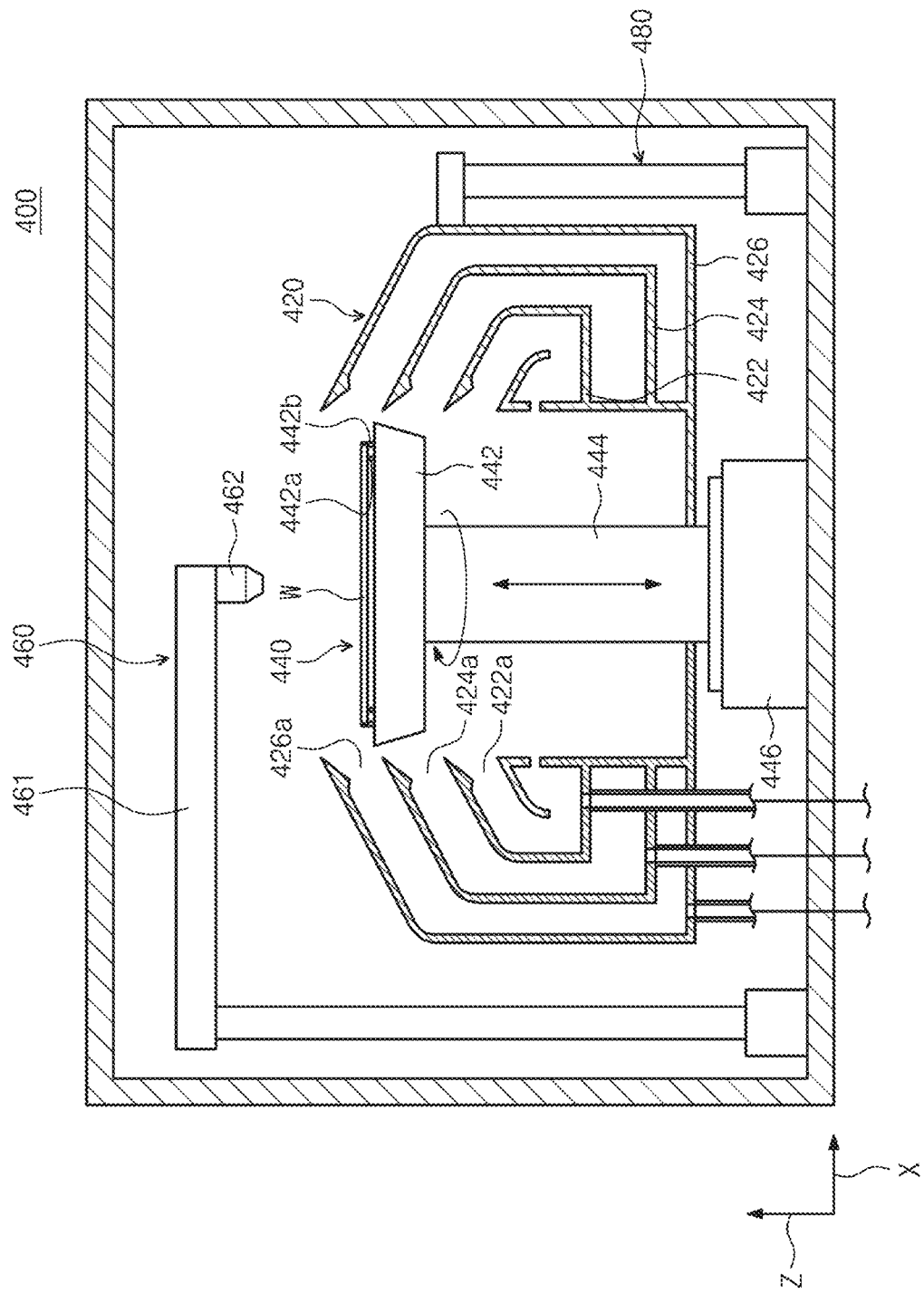
FIG. 4 is a view schematically illustrating an embodiment of a liquid treating chamber of FIG. 3.

FIG. 4 is a view schematically illustrating an embodiment of the liquid treating chamber of FIG. 1. Referring to FIG. 4, the liquid treating chamber 400 includes a housing 410, a cup 420, a support unit 440, a liquid supply unit 460, and a lifting/lowering unit 480.

The housing 410 may have an inner space in which the substrate W is treated. The housing 410 may have a generally hexahedral shape. For example, the housing 410 may have a rectangular parallelepiped shape. In addition, an opening (not shown) through which the substrate W is taken in or taken out may be formed in the housing 410. In addition, a door (not shown) for selectively opening and closing the opening may be installed in the housing 410.

The cup 420 may have a container shape with an open top. The cup 420 may have a treating space, and the substrate W may be liquid-treated in the treating space. The support unit 440 supports the substrate W in the treating space. The liquid supply unit 460 supplies the treating liquid onto the substrate W supported by the support unit 440. The treating liquid may be provided in a plurality of types and may be sequentially supplied onto the substrate W. The lifting/lowering unit 480 adjusts a relative height between the cup 420 and the support unit 440.

In an embodiment, the cup 420 has a plurality of recollecting containers 422, 424, and 426. Each of the recollecting containers 422, 424, and 426 has a recollecting space for recollecting the liquid used for substrate treatment. Each of the recollecting containers 422, 424, and 426 is provided in a ring shape surrounding the support unit 440. During a liquid treatment process, the treating liquid scattered by a rotation of the substrate W is introduced into the recollecting space through the inlets 422a, 424a, and 426a of each respective recollecting container 422, 424, and 426. According to an embodiment, the cup 420 has a first recollecting container 422, a second recollecting container 424, and a third recollecting container 426. The first recollecting container 422 is disposed to surround the support unit 440, the second recollecting container 424 is disposed to surround the first recollecting container 422, and the third recollecting container 426 is disposed to surround the second recollecting container 424. The second inlet 424a introducing the liquid into the second recollecting container 424 may be located above the first inlet 422a introducing the liquid into the first recollecting container 422, and the third inlet 426a introducing the liquid into the third recollecting container 424a may be located above the second inlet 424a.

The support unit 440 has a support plate 442 and a drive shaft 444. A top surface of the support plate 442 is provided in a substantially circular shape and may have a diameter larger than that of the substrate W. A support pin 442a is provided at a central part of the support plate 442 to support a bottom surface of the substrate W, and the support pin 442a is provided to protrude from the support plate 442 such that the substrate W is spaced apart from the support plate 442 by a predetermined distance. A chuck pin 442b is provided at an edge of the support plate 442. The chuck pin 442b is provided to upwardly protrude from the support plate 442, and supports a side of the substrate W so that the substrate W is stably held by the support unit 440 when the substrate W is rotated. The drive shaft 444 is driven by the driver 446, is connected to the center of the bottom surface of the substrate W, and rotates the support plate 442 based on its central axis.

According to an embodiment, the liquid supply unit 460 may include a nozzle 462. The nozzle 462 may supply the treating liquid to the substrate W. The treating liquid may be a chemical, a rinsing liquid, or an organic solvent. The chemical may be a chemical with strong acid properties or strong base properties. In addition, the rinsing liquid may be a deionized water. In addition, the organic solvent may be an isopropyl alcohol (IPA). In addition, the treating liquid supplied by the liquid supply unit 460 may be a solvent. For example, the treating liquid supplied by the liquid supply unit 460 may be a developing liquid. For example, the developing liquid supplied by the liquid supply unit 460 may include an N-butyl acetate.

In addition, the liquid supply unit 460 may include a plurality of nozzles 462, and each nozzle 462 may supply a different type of treating liquid. For example, one of the nozzles 462 may supply a chemical, another one of the nozzles 462 may supply the rinsing liquid, and still another one of the nozzles 462 may supply an organic solvent. In addition, the controller 30 may control the liquid supply unit 460 to supply the organic solvent from the still another one of the nozzles 462 to the substrate W after supplying the rinsing liquid to the substrate W from the another one of the nozzles 462. Accordingly, the rinsing liquid supplied onto the substrate W may be substituted with an organic solvent having a small surface tension. In addition, the developing liquid may be supplied from any one of the nozzles 462.

The lifting/lowering unit 480 moves the cup 420 in the up/down direction. A relative height between the cup 420 and the substrate W is changed by the up/down vertical movement of the cup 420. As a result, the recollecting containers 422, 424, 426 for recollecting the treating liquid are changed in accordance with a type of liquid supplied to the substrate W, so that the liquids can be recollected separately. Unlike the above description, the cup 420 is fixedly installed, and the lifting/lowering unit 480 may move the support unit 440 in the up/down direction.

Figure 5:
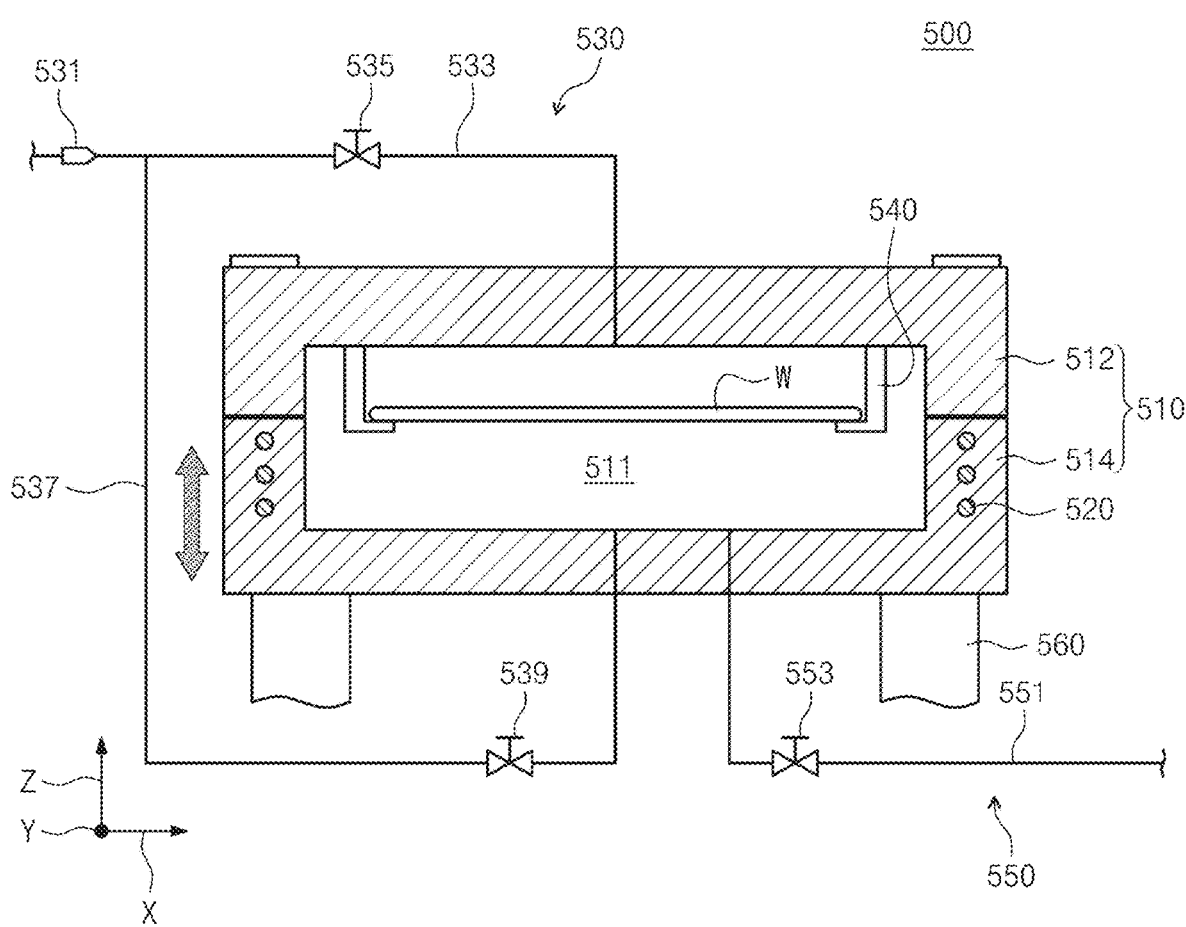
FIG. 5 is a view schematically illustrating an embodiment of a drying chamber of FIG. 3.

FIG. 5 is a view schematically illustrating an embodiment of the drying chamber of FIG. 3. Referring to FIG. 5, the drying chamber 500 according to an embodiment of the inventive concept may remove the treating liquid remaining on the substrate W by using the treating fluid F in a supercritical state. The treating liquid to be removed may be any one of the above-described chemical, rinsing liquid, organic solvent, or developing liquid. In addition, the treating fluid F may include a carbon dioxide $CO_2$. For example, the drying chamber 500 may remove the N-butyl acetate developing liquid remaining on the substrate W from the substrate W using the carbon dioxide $CO_2$ in a supercritical state.

The drying chamber 500 may include a body 510, a heating member 520, a fluid supply unit 530, a support member 540, a fluid discharge unit 550, and a lifting/lowering member 560.

The body 510 may have an inner space 511 for treating the substrate W. The body 510 may provide an inner space 511 for treating the substrate W. The body 510 may provide an inner space 511 in which the substrate W is dry-treated by the treating fluid F in a supercritical state. The body 510 may also be referred to as a chamber.

The body 510 may include a top body 512 and a bottom body 514. The top body 512 and the bottom body 514 may be combined with each other to form the inner space 511. Any one of the top body 512 or the bottom body 514 may be coupled to the lifting/lowering member 560 to be moved in the up/down direction. For example, the bottom body 514 may be coupled to the lifting/lowering member 560 to be moved in the up/down direction by the lifting/lowering member 560. Accordingly, the inner space 511 of the body 510 may be selectively sealed. In the above-described example, the bottom body 514 is coupled to the lifting/lowering member 560 to move in the up/down direction, but this invention is not limited to it. For example, the top body 512 may be coupled to the lifting/lowering member 560 to move in the up/down direction.

The heating member 520 may heat the treating fluid F supplied to the inner space 511. The heating member 520 may increase a temperature of the inner space 511 of the body 510. As the heating member 520 increases the temperature of the inner space 511, the treating fluid F supplied to the inner space 511 may be changed into a supercritical state or maintained in a supercritical state.

In addition, the heating member 520 may be buried in the body 510. For example, the heating member 520 may be buried in any one of the top body 512 or the bottom body 514. For example, the heating member 520 may be provided in the bottom body 514. However, the inventive concept is not limited thereto, and the heating member 520 may be provided at various positions capable of raising the temperature of the inner space 511. In addition, the heating member 520 may be a heater. However, the inventive concept is not limited thereto, and the heating member 520 may be variously modified into a known device capable of raising the temperature of the inner space 511.

The fluid supply unit 530 may supply the treating fluid F to the inner space 511 of the body 510. The treating fluid F supplied by the fluid supply unit 530 may include a carbon dioxide CO2. The fluid supply unit 530 may include a fluid supply source 531, a first supply line 533, a first supply valve 535, a second supply line 537, and a second supply valve 539.

The fluid supply source 531 may store the treating fluid F to be supplied to the inner space 511 of the body 510 or supply the treating fluid F to the inner space 511. The fluid supply source 531 may supply the treating fluid F to the inner space 511 via the first supply line 533 and/or the second supply line 537. In addition, the first supply valve 535 may be installed on the first supply line 533. In addition, a second supply valve 539 may be installed on the second supply line 537. The first supply valve 535 and the second supply valve 539 may be on/off valves, for example, opening/closing valves. The first supply valve 535 and the second supply valve 539 may be flow control valves. As the first supply valve 535 and the second supply valve 539 are opened and closed, the treating fluid F may selectively flow through the first supply line 533 or the second supply line 537.

An end of the first supply line 533 may communicate with the inner space 511. The first supply line 533 may be a top supply line that supplies the treating fluid F, which is a drying gas, to the inner space 511 of the body 510 from a top side. At least a portion of the first supply line 533 may be provided to the top body 512. In addition, the first supply line 533 may be configured such that a supply of the treating fluid F is directed to a top surface of the substrate W supported by the support member 540. For example, the treating fluid F supplied from the first supply line 533 may be supplied to the top surface of the substrate W. The treating fluid F supplied from the first supply line 533 may flow in a downward direction. For example, the treating fluid F supplied from the first supply line 533 may flow from above the substrate W supported in the inner space 511 to below the substrate W.

An end of the second supply line 537 may communicate with the inner space 511. The second supply line 537 may be a bottom supply line that supplies the treating fluid F, which is a drying gas, to the inner space 511 of the body 510 from a bottom side. At least a portion of the second supply line 537 may be provided to the bottom body 514. In addition, the second supply line 537 may be configured such that the supply of the treating fluid F is directed to a bottom surface of the substrate W supported by the support member 540. For example, the treating fluid F supplied from the second supply line 537 may flow in an upward direction. For example, the treating fluid F supplied from the second supply line 537 may flow from below the substrate W supported in the inner space 511 to above the substrate W.

In the above-described example, the first supply line 533 and the second supply line 537 are connected to one fluid supply source 531, but the inventive concept is not limited thereto. For example, a plurality of fluid supply sources 531 may be provided, the first supply line 533 may be connected to any one of a plurality of fluid supply sources 531, and the second supply line 537 may be connected to another one of the fluid supply sources 531.

In addition, a device such a pressure sensor, a temperature sensor, a flow control valve, an orifice or a heater may be variously installed and disposed at the first supply line 533, the second supply line 533, or a line between a point where the first supply line 533 connects with the second supply line 537 and the fluid supply source 531.

The support member 540 may support the substrate W in the inner space 511. The support member 540 may be configured to support an edge region of the substrate W in the inner space 511. For example, the support member 540 may be configured to support a lower surface of the edge region of the substrate W in the inner space 511.

The fluid discharge unit 550 may discharge the treating fluid F from the inner space 511 of the body 510 to the outside. The fluid discharge unit 550 may include a fluid discharge line 551 and a discharge valve 553. An end of the fluid discharge line 551 may communicate with the inner space 511. At least a portion of the fluid discharge line 551 may be provided to the bottom body 514. The fluid discharge line 551 may be configured such that when the treating fluid F is discharged from the inner space 511, the treating fluid F flows in a direction from a top to a bottom of the inner space 511.

In addition, the discharge valve 553 may be installed on the fluid discharge line 551. The discharge valve 553 may be an on/off valve, for example, an opening/closing valve. The discharge valve 553 may be a flow control valve. A device such as an orifice, a pressure sensor, a temperature sensor, and a pump may be variously installed and disposed on the fluid discharge line 551.

Hereinafter, a method of treating the substrate according to an embodiment of the inventive concept will be described. The substrate treating method described below may be performed by a substrate treating apparatus. As described above, the controller 30 may control the substrate treating apparatus so that the substrate treating apparatus may perform the substrate treating method described below.

Figure 6:
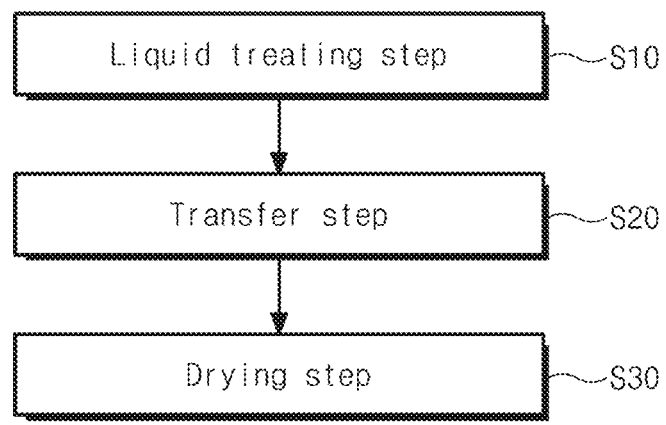
FIG. 6 is a flowchart illustrating a substrate treating method according to an embodiment of the inventive concept.
Figure 7:
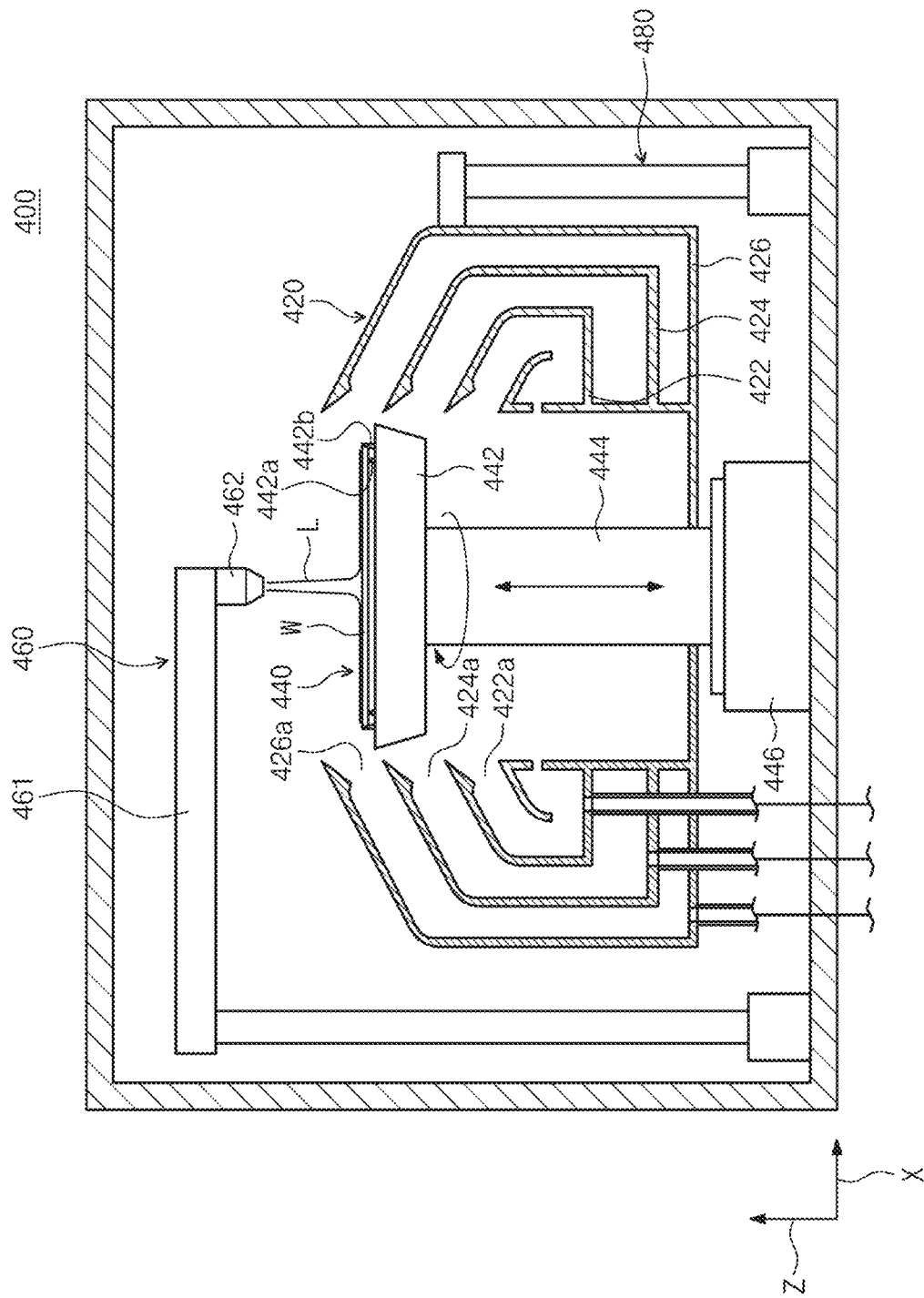
FIG. 7 is a view illustrating the liquid treating chamber performing a liquid treating step of FIG. 6.

FIG. 6 is a flowchart illustrating a substrate treating method according to an embodiment of the inventive concept. Referring to FIG. 6, a substrate treating method according to an embodiment of the inventive concept may include a liquid treating step S10, a transfer step S20, and a drying step S30.

The liquid treating step S10 is a step of liquid-treating the substrate W by supplying the treating liquid to the substrate W. The liquid treating step S10 may be performed in the liquid treating chamber 400. For example, in the liquid treating step S10, the substrate W may be liquid-treated by supplying the treating liquid L to a rotating substrate W (see FIG. 7). The treating liquid L supplied in the liquid treating step S10 may be at least one of the above-described chemical, rinsing liquid, organic solvent, and developing liquid. For example, in the liquid treating step S10, the substrate W may be rinse-treated by supplying a rinsing liquid to the rotating substrate W. Thereafter, an organic solvent may be supplied to the rotating substrate W to replace the rinsing liquid remaining on the substrate W with the organic solvent. In addition, for example, in the liquid treating step S10, the substrate W may be developed by supplying the developing liquid to the rotating substrate W.

The transfer step S20 is a step of transferring the substrate W. The transfer step S20 may be a step of transferring the substrate W on which the liquid treatment has been performed in the treating chamber 400 to the drying chamber 500. For example, in the transfer step S20, the transfer robot 320 may transfer the substrate W from the liquid treating chamber 400 to the inner space 511 of the drying chamber 500. A treating liquid L may remain on the substrate W to be transferred in the transfer step S20. For example, the organic solvent may remain on the substrate W. For example, the developing liquid may remain on the substrate W. That is, the substrate W may be transferred to the drying chamber 500 while its top surface is wetted with the developing liquid or the organic solvent, thereby minimizing a leaning of patterns formed on the substrate W.

The drying step S30 is a step of drying the substrate W using the treating fluid F in a supercritical state after the substrate W is introduced into the inner space 511. The drying step S30 may be performed in the drying chamber 500. In the drying step S30, the substrate W may be dried by supplying the treating fluid F in the inner space 511 of the body 510 to the substrate W. For example, in the drying step S30, the treating fluid F may be supplied to the inner space 511. In the drying step S30, the treating fluid in the supercritical state may be transferred to the substrate. The treating fluid F in a supercritical state transferred to the substrate W is mixed with the treating liquid L remaining on the top surface of the substrate W. And as the treating fluid F mixed with the treating liquid L is discharged from the inner space 511, the treating liquid L may be removed from the substrate W.

Figure 8:
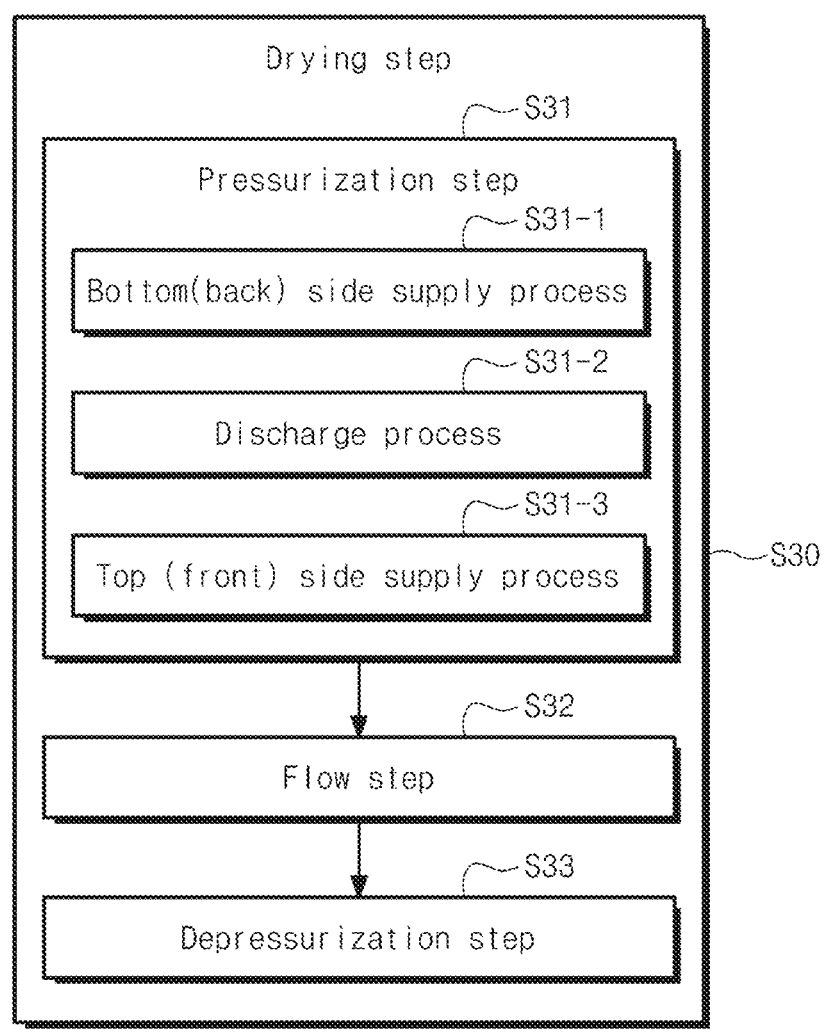
FIG. 8 is a detailed flowchart of a drying step of FIG. 6.
Figure 9:
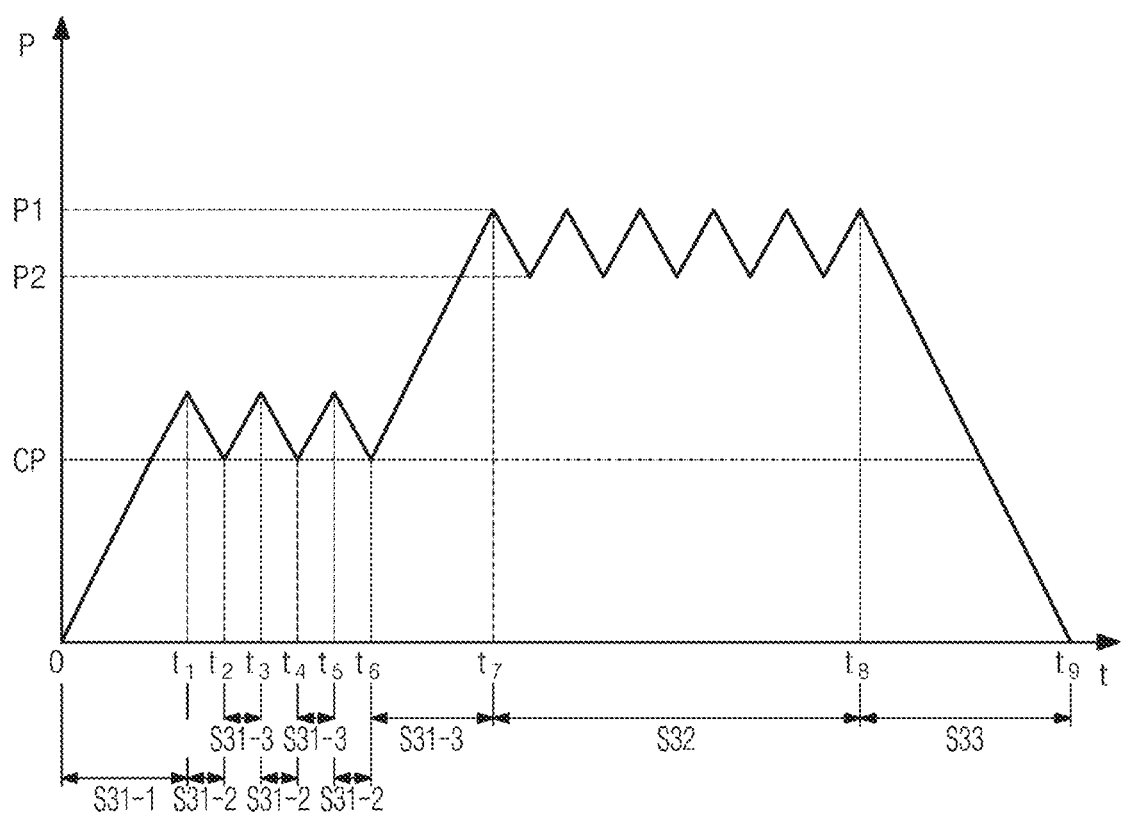
FIG. 9 is a graph illustrating an example of a pressure change in an inner space of a body while performing the drying step of the inventive concept.
Figure 10:
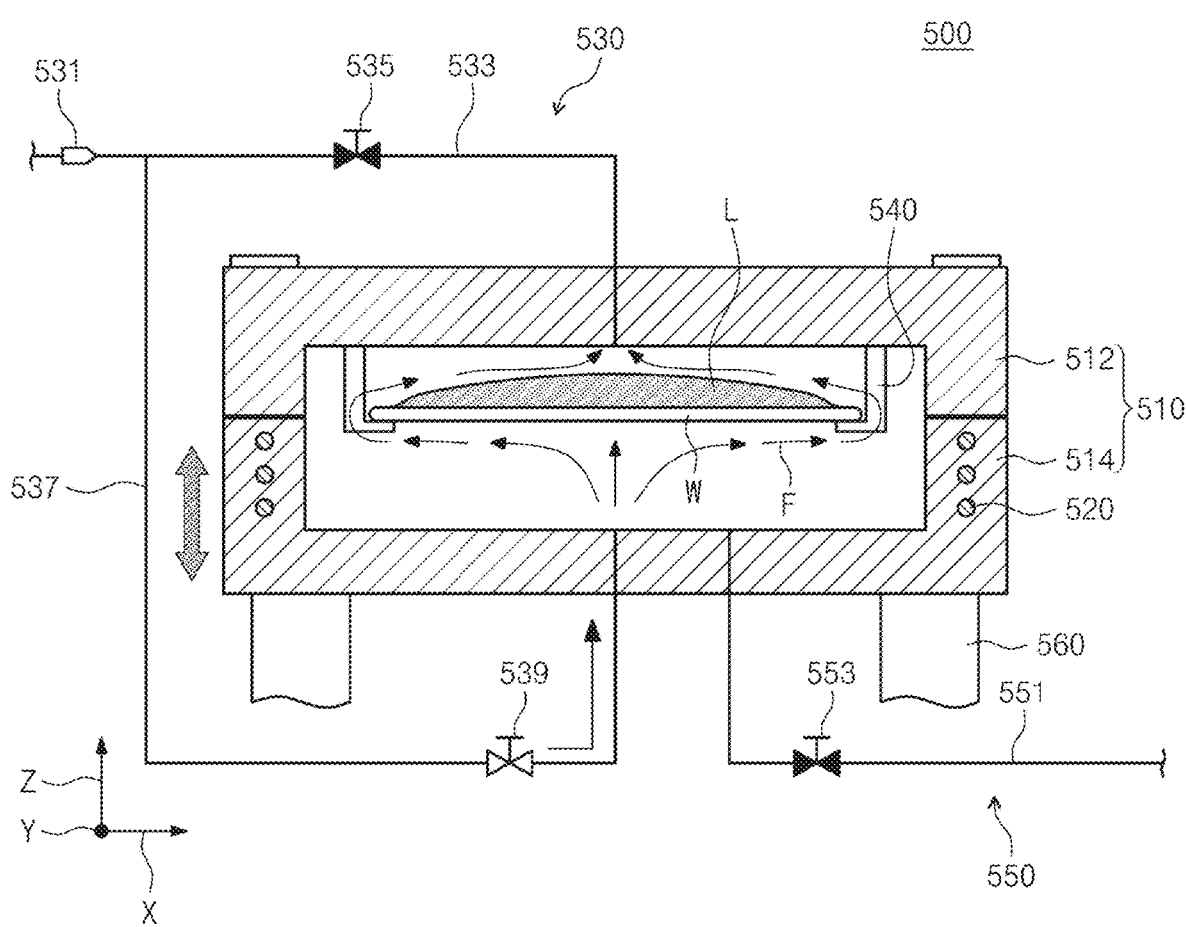
FIG. 10 is a view illustrating the drying chamber performing a bottom supply process of FIG. 8 and FIG. 9.
Figure 11:
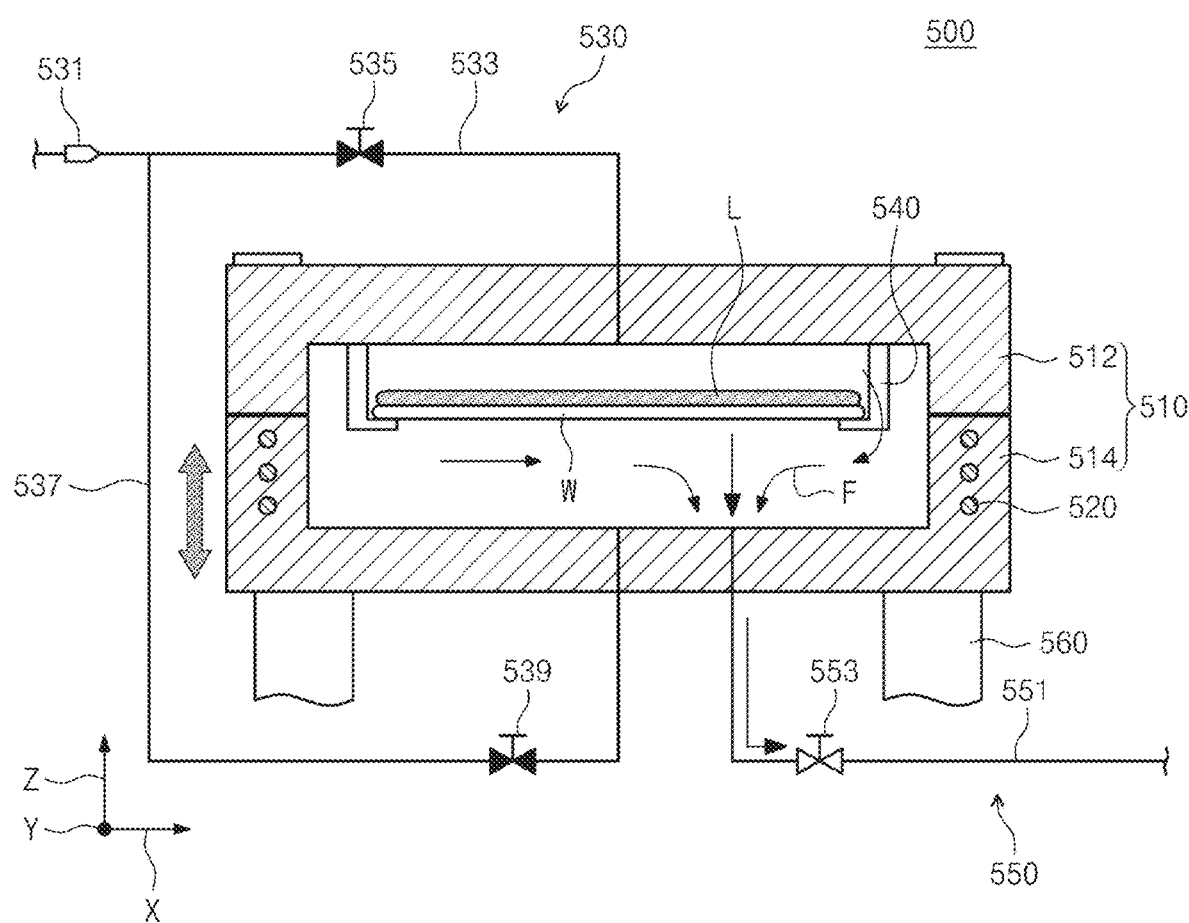
FIG. 11 is a view illustrating the drying chamber performing a discharge process of FIG. 8 and FIG. 9.
Figure 12:
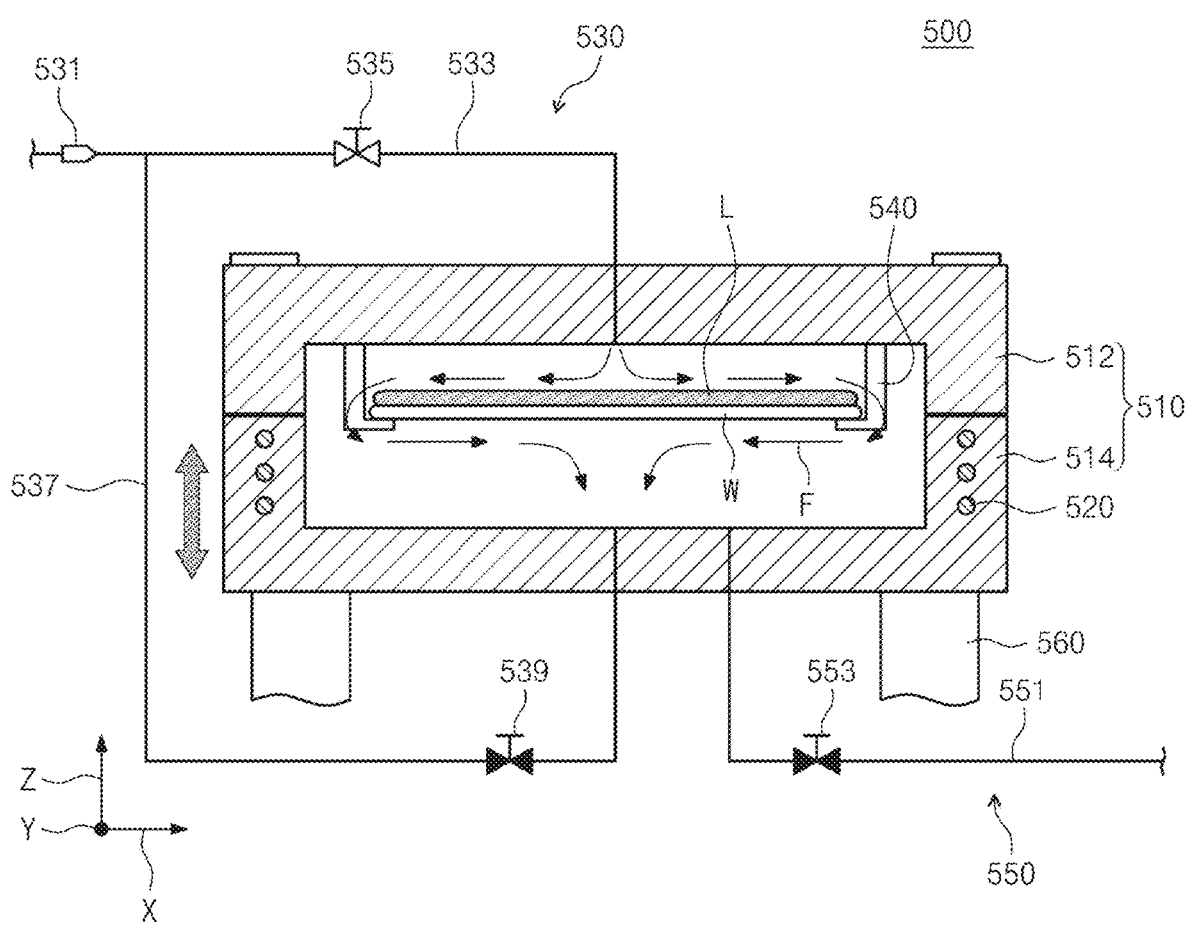
FIG. 12 is a view illustrating the drying chamber performing a top supply process of FIG. 8 and FIG. 9.

Hereinafter, the drying step S30 according to an embodiment of the inventive concept will be described in more detail. FIG. 8 is a detailed flowchart of the drying step of FIG. 6, and FIG. 9 is a graph showing an example of a pressure change in the inner space of the body during the drying step of the inventive concept. Referring to FIG. 8 and FIG. 9, the drying step S30 according to an embodiment of the inventive concept may include a pressurization step S31, a flow step S32, and a depressurization step S33. The pressurization step S31, the flow step S32, and the depressurization step S33 may be sequentially performed.

The pressurization step S31 may be a step of increasing the pressure of the inner space 511 to a preset pressure, for example, a first pressure P1. The pressurization step S31 may be performed after the substrate W is introduced into the inner space 511. In the pressurization step S31, the treating fluid F may be supplied to the inner space 511 to increase the first pressure P1 of the inner space 511.

The pressurization step S31 may include a bottom (back) side supply process S31-1, a discharge process S31-2, and a top (front) side supply process S31-3.

The bottom side supply process S31-1 may be a process of increasing the pressure of the inner space 511 by supplying the treating fluid F toward the back surface of the substrate W. In the bottom side supply process S31-1, the second supply line 537 may supply the treating fluid F to the back surface of the substrate W (see FIG. 10). During the bottom side supply process S31-1, the first supply valve 535 may be turned off, the second supply valve 539 may be turned on, and the discharge valve 553 may be turned off. Also, during the bottom side supply process (S31-1), since the second supply line 537, which is the bottom supply line, supplies the treating fluid F in a direction from a bottom to a top of the inner space 511, an upward flow may occur in the inner space 511. Due to this upward flow, a liquid film formed by the treating liquid L on the top surface of the substrate W may have an upwardly curved shape.

The discharge process S31-2 may be performed after the bottom side supply process S31-1. In the discharge process S31-2, the discharge line 551 may discharge the treating fluid F from the inner space 511 (see FIG. 11). During the discharge process S31-2, the first supply valve 535 may be turned off, the second supply valve 539 may be turned off, and the discharge valve 553 may be turned on. That is, the discharge process S31-2 may be a process of lowering the pressure of the inner space 511. In addition, during the discharge process S31-2, since the discharge line 551 discharges the treating fluid F in a direction from the top to the bottom of the inner space 511, a downward flow may be generated in the inner space 511. Due to this downward flow, the liquid film formed by the treating liquid L on the top surface of the substrate W may be pressed downwardly. That is, the liquid film formed on the substrate W may become flat.

The top side supply process S31-3 may be a process of increasing the pressure of the inner space 511 by supplying the treating fluid F toward the top surface of the substrate W. In the top side supply process S31-3, the treating fluid F may be supplied to the top surface of the substrate W. In the top side supply process S31-3, the treating fluid F supplied by the first supply line 533 from a top of the inner space 511 above the substrate W to the top surface of the substrate W may flow to a bottom of the inner space 511 below the substrate W (see FIG. 12). During the top side supply process S31-3, the first supply valve 535 may be turned on, the second supply valve 539 may be turned off, and the discharge valve 553 may be turned off. Also, during the top side supply process S31-3, since the first supply line 533, which is the top supply line, supplies the treating fluid F in a direction from a top to a bottom of the inner space 511, a downward flow may occur in the inner space 511. Due to the downward flow, the liquid film formed by the treating liquid L on the top surface of the substrate W may be pressed downward. That is, the liquid film formed on the substrate W may become flat.

In the pressurization step S31 according to an embodiment of the inventive concept, after the bottom side supply process S31-1 is performed, the top supply process S31-3 and the discharge process S31-2 may each be repeated at least once. That is, the pressurization step S31 according to an embodiment of the inventive concept may include pressure pulsing sections t1 to t6 in which a pressure fluctuates due to a partial pressure difference. In the case the pressure of the inner space 511 is increased to the target first pressure P1 only by the bottom side supply process S31-1, the treating liquid L remaining on the substrate W may be changed into an upwardly curved shape by the upward flow, and a drying mark or a plurality of defects may occur in the edge region of the substrate W.

However, according to an embodiment of the inventive concept, the above-described top side supply process S31-3 and discharge process S31-2 may be performed before the pressure of the inner space 511 reaches the first pressure P1, which is a preset pressure (before entering a flow step S32. That is, in an embodiment of the inventive concept, the top side supply process S31-3 and the discharge process S31-2 forming the downward flow in the pressurization step S31 are each repeated at least once, thereby uniformly spreading the treating liquid L remaining on the substrate W in the pressurization step S31. That is, a thickness of the liquid film may be stabilized. In other words, the thickness of the liquid film can be uniform and/or the top surface of the liquid film can be relatively flat. Accordingly, a non-uniform evaporation of the treating liquid L may be minimized. Accordingly, a risk of occurrence of the above-described drying marks or a plurality of defects in the pressurization step S31 may be minimized. In addition, the discharge process S31-2 and the top side supply process S31-3 may be continuously performed. In this case, a downward flow in the inner space 511 is generated more strongly, and thus a spreading of the treating liquid L remaining on the substrate W may occur more efficiently. In addition, since the liquid film of the treating liquid L flows repeatedly in the pressure pulsing sections t1 to t6, there is an advantage of minimizing a hardening of the liquid film of the treating liquid L.

In addition, a lower limit of a pressure range of the inner space 511 in the pressure pulsing sections t1 to t6 of this invention may be equal to or higher than a critical pressure CP (e.g., about 73.8 Bar), more specifically higher than a critical pressure CP, through which the treating fluid F is converted to a supercritical state. In other words, the lower limit of the pressure range of the inner space 511 varied by the top side supply process S31-3 and the discharge process S31-2 may be higher than the critical pressure CP. In addition, the upper limit of the pressure range of the inner space 511 varied by the top side supply process S31-3 and the discharge process S31-2 may be about 73.8 bar to about 93.8 bar.

That is, the pressure pulsing sections t1 to t6 of this invention are executed when the treating liquid L and the supercritical treating fluid F are mixed (that is, when a surface tension of the treating liquid L is not great), so that an adhesion between the surface of the substrate W and the treating liquid L can be minimized. Accordingly, it is possible to minimize a defect caused by particles and by-products on the substrate W.

The flow step S32 may be performed after the pressurization step S31. In the flow step S32, the treating fluid F may be supplied to the inner space 511 or the treating fluid F may be discharged from the inner space 511. For example, while the treating fluid F is supplied from the flow step S32 to the inner space 511, the treating fluid F may not be discharged from the inner space 511. In addition, while the treating fluid F is discharged from the inner space 511 in the flow step S32, the treating fluid F may not be supplied to the inner space 511. That is, in the flow step 32, the pressure of the inner space 511 may vary by the partial pressure difference. In the flow step S32, the pressure of the inner space 511 may be repeatedly pulsed between the first pressure P1 and the second pressure P2. The second pressure P2 may be a pressure lower than the first pressure P1. The first pressure P1 may be about 180 bar. The second pressure P2 may be about 80 bar.

In the flow step S32, a flow is generated in the treating fluid F supplied to the inner space 511 and thus the treating liquid L remaining on the substrate W may be more effectively removed from the substrate W. The flow step S32 may be referred to as a treating step.

The depressurization step S33 may be performed after the flow step S33. In the depressurization step S33, the pressure of the inner space 511 of the body 510 may be lowered. For example, in the depressurization step S33, the pressure of the inner space 511 of the body 510 may be lowered to an atmospheric pressure.

Figure 13:
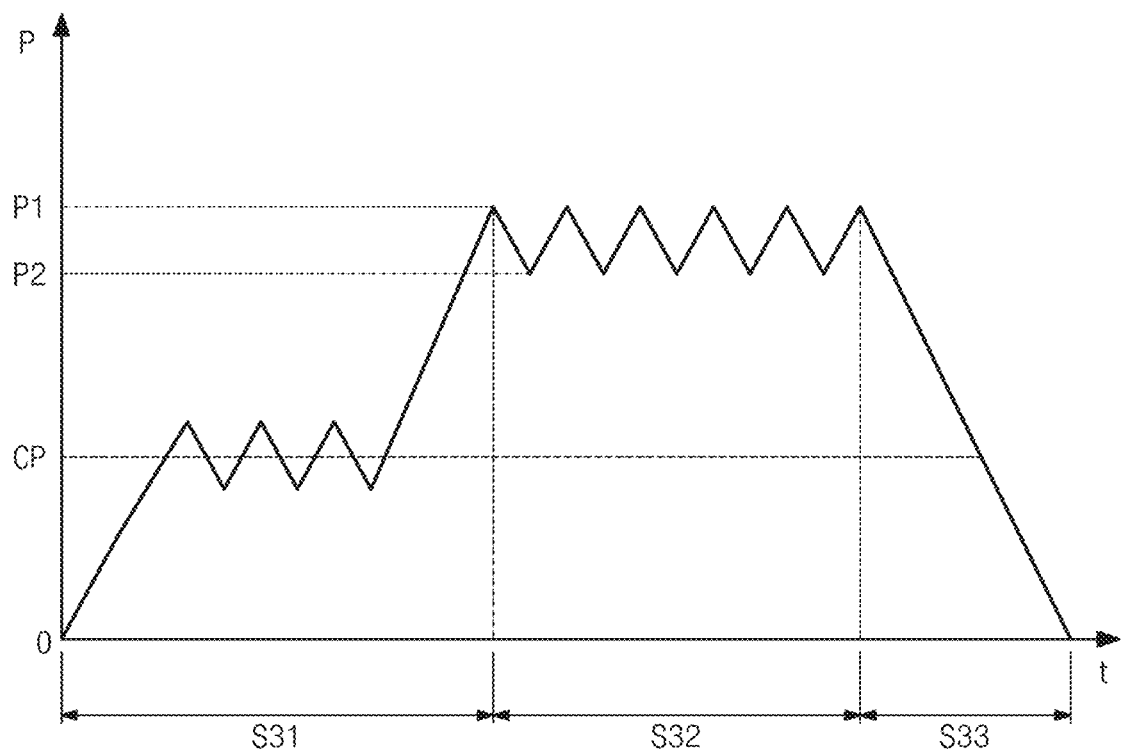
FIG. 13 is a graph illustrating another example of the pressure change in the inner space of the body while performing the drying step of the inventive concept.

In the aforementioned example, the lower limit of the pressure range of the inner space 511 of the pressure pulsing sections t1 to t6 is higher than or equal to the critical pressure CP, specifically, higher than the critical pressure CP, but is not limited to it. For example, as shown in FIG. 13, the lower limit of the pressure range of the pressure pulsing section included in the pressurization step S31 may be lower than the critical pressure CP. That is, the critical pressure CP may be included in the pressure range of the inner space 511 varied by the top side supply process S31-3 and the discharge process S31-2. Alternatively, both the upper limit and the lower limit of the pressure range of the pressure pulsing section may be lower than the critical pressure CP. That is, the pressure range of the pressure pulsing section may be variously changed according to the type of treating liquid L supplied to the substrate W, the amount in which the treating liquid L remains on the substrate W, and the shape of the pattern formed on the substrate W.

Figure 14:
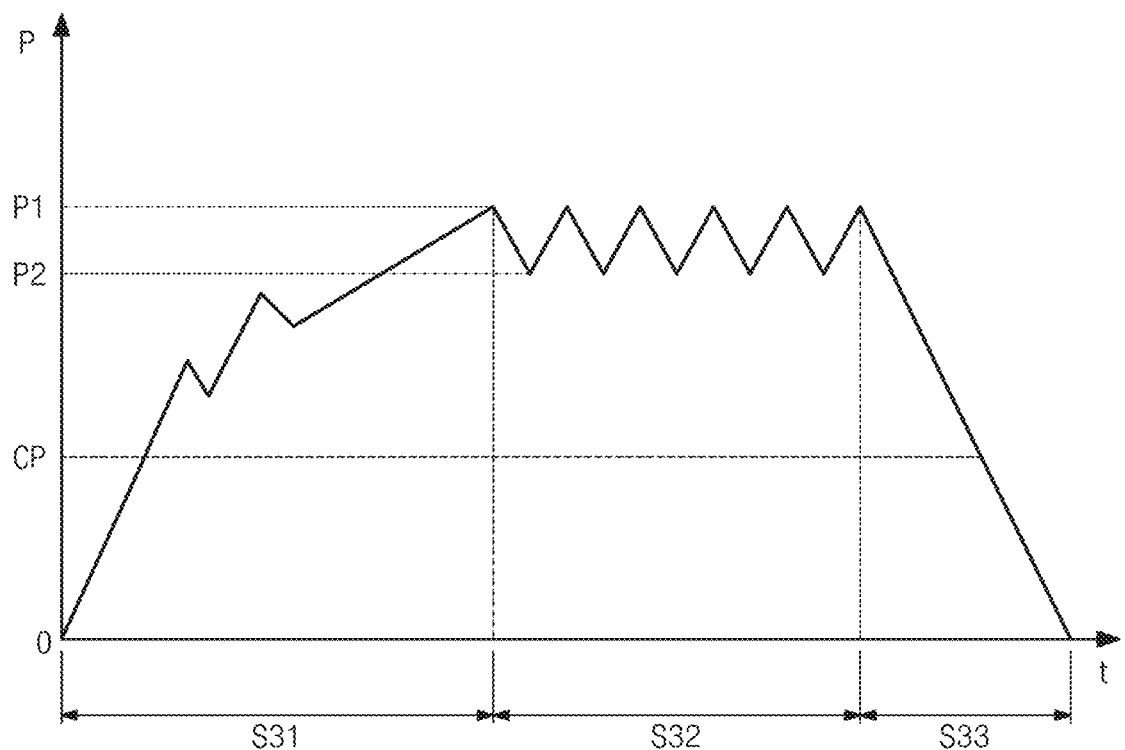
FIG. 14 is a graph illustrating another example of the pressure change in the inner space of the body while performing the drying step of the inventive concept.

In the aforementioned example, the increase and decrease of pressure in the pressure pulsing sections t1 to t6 are generally the same width, but this invention is not limited thereto. For example, as illustrated in FIG. 14, a decreased amount of the pressure in the pressure pulsing section may be smaller than an increased amount of the pressure in the pressure pulsing section. In this case, it may be advantageous to reach a preset first pressure P1 within a faster time.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a body configured to at least partially enclose an inner space;
a support member configured to support a substrate in the inner space;
a fluid supply unit configured to supply a treating fluid for drying the substrate to the inner space;
a fluid discharge unit configured to discharge the treating fluid from the inner space; and
a controller configured to control the fluid supply unit and the fluid discharge unit,
wherein the fluid supply unit comprises,
a top supply line configured to supply the treating fluid in a downward direction toward a top side of the substrate supported by the support member; and
a bottom supply line configured to supply the treating fluid in an upward direction toward a back side of the substrate supported by the support member, and
wherein, during a pressurization step of increasing a pressure of the inner space to a preset pressure after the substrate is taken into the inner space, the controller is configured to control the fluid supply unit and the fluid discharge unit so that at least one of a supply of the treating fluid from the top supply line and a discharge of the treating fluid from the fluid discharge unit is performed at least once, respectively, before the pressure of the inner space reaches the preset pressure, and
wherein the controller is further configured to control the fluid supply unit so that a supply of the treating fluid from the bottom supply line is performed during the pressurization step, and a time of the supply of the treating fluid from the top supply line is later than a time of the supply of the treating fluid from the bottom supply line.

2. The substrate treating apparatus of claim 1, wherein the controller is further configured to control the fluid supply unit and the fluid discharge unit so that at least one of a supply of the treating fluid from the top supply line and a discharge of the treating fluid from the fluid discharge unit is performed two or more times.

3. The substrate treating apparatus of claim 1, wherein the top supply line is configured to supply the treating fluid toward a top surface of the substrate supported by the support member.

4. The substrate treating apparatus of claim 1, wherein the fluid discharge unit comprises:
a fluid discharge line fluidly coupled to the inner space; and
a discharge valve at the fluid discharge line, and
wherein the fluid discharge line is configured such that, when the treating fluid is discharged, the treating fluid flows from a top to a bottom of the inner space.

5. The substrate treating apparatus of claim 1 further comprising a heating member configured to increase a temperature of the inner space so the treating fluid supplied to the inner space is converted to a supercritical state or may maintain the supercritical state, wherein
the treating fluid supplied by the fluid supply unit comprises a carbon dioxide $CO_2$.

6. The substrate treating apparatus of claim 1, wherein the top supply line is located in a top portion of the body and directly above the substrate supported by the support member.

7. The substrate treating apparatus of claim 1, wherein, the controller is further configured to control the fluid supply unit and the fluid discharge unit so that each of the supply of the treating fluid from the top supply line and the discharge of the treating fluid from the fluid discharge unit are performed two or more times before the pressure of the inner space reaches the preset pressure.

8. The substrate treating apparatus of claim 2, wherein, the controller is further configured to control the fluid supply unit and the fluid discharge unit such that performing the supply of the treating fluid from the top supply line and the discharge of the treating fluid from the fluid discharge unit two or more times creates pressure fluctuations in the pressure of the inner space, a lower limit of the pressure fluctuations is equal to or higher than a critical pressure, and the treating fluid is converted to a supercritical state at the critical pressure.

9. The substrate treating apparatus of claim 1, wherein, in a flow step succeeding the pressurization step, the controller is further configured to control the fluid supply unit and the fluid discharge unit to alternatively supply the treating fluid to the inner space and discharge the treating fluid from the inner space.

10. The substrate treating apparatus of claim 9, wherein successively supplying the treating fluid to the inner space and discharging the treating fluid from the inner space varies the pressure of the inner space between the preset pressure and a first pressure lower than the preset pressure.

* * * * *